(12) United States Patent
Burger et al.

(10) Patent No.: US 10,923,605 B2
(45) Date of Patent: Feb. 16, 2021

(54) OPTOELECTRONIC APPARATUS

(71) Applicant: Vishay Semiconductor GmbH, Heilbronn (DE)

(72) Inventors: Daniel Burger, Leingarten (DE); Sascha Kuhn, Oedheim (DE); Peter Mühleck, Offenau (DE)

(73) Assignee: Vishay Semiconductor GmbH, Heilbronn (DE)

( * ) Notice: Subject to any disclaimer, the term of this patent is extended or adjusted under 35 U.S.C. 154(b) by 0 days.

(21) Appl. No.: 16/078,507

(22) PCT Filed: Feb. 22, 2017

(86) PCT No.: PCT/EP2017/054075
§ 371 (c)(1),
(2) Date: Aug. 21, 2018

(87) PCT Pub. No.: WO2017/144538
PCT Pub. Date: Aug. 31, 2017

(65) Prior Publication Data
US 2019/0067494 A1 Feb. 28, 2019

(30) Foreign Application Priority Data

Feb. 23, 2016 (DE) .................. 10 2016 103 136

(51) Int. Cl.
*H01L 31/02* (2006.01)
*H01L 31/0203* (2014.01)
(Continued)

(52) U.S. Cl.
CPC .... *H01L 31/02005* (2013.01); *H01L 31/0203* (2013.01); *H01L 31/02325* (2013.01);
(Continued)

(58) Field of Classification Search
CPC ....... H01L 33/00; H01L 33/04; H01L 33/507; H01L 33/56; H01L 33/62; H01L 33/64;
(Continued)

(56) References Cited

U.S. PATENT DOCUMENTS

| 4,972,089 A | 11/1990 | Stevenson |
| 6,905,187 B2 * | 6/2005 | Arquilevich ............. B41J 2/125 347/19 |

(Continued)

FOREIGN PATENT DOCUMENTS

| DE | 10241934 A1 | 4/2003 |
| DE | 102004040218 A1 | 3/2006 |

(Continued)

*Primary Examiner* — Natalia A Gondarenko
(74) *Attorney, Agent, or Firm* — Volpe Koenig

(57) ABSTRACT

An optoelectronic apparatus is provided, comprising a carrier device that has a longitudinal extent and a transverse extent, wherein the carrier device has a plurality of electrically conductive tracks aligned in parallel with the longitudinal extent, and wherein the carrier device has a plurality of contact chambers aligned in parallel with the transverse extent at an upper side. Each of the contact tracks is electrically contactable in each contact chamber to be able to install at least one optoelectronic transmitter and/or at least one optoelectronic receiver in a variable mounting in the respective chamber.

18 Claims, 8 Drawing Sheets

(51) Int. Cl.
*H01L 31/0232* (2014.01)
*H01L 31/12* (2006.01)
*H01L 31/167* (2006.01)
*H01L 33/62* (2010.01)

(52) U.S. Cl.
CPC ........ *H01L 31/02327* (2013.01); *H01L 31/12* (2013.01); *H01L 31/167* (2013.01); *H01L 33/62* (2013.01)

(58) Field of Classification Search
CPC ... H01L 33/641; H01L 33/642; H01L 33/644; H01L 25/042; H01L 25/0655; H01L 25/072; H01L 25/0753; H01L 25/167; H01L 25/165; H01L 2924/12041; H01L 2924/163; H01L 2924/1631; H01L 2924/16315; H01L 2924/351; H01L 2933/0058; H01L 2933/0075; H01L 2933/05; H01L 27/144–1461; H01L 27/14636; H01L 27/14638; H01L 27/14643–14663; H01L 27/14649; H01L 27/32; H01L 27/14627; H01L 27/14652; H01L 27/14669; H01L 27/14694; H01L 27/153; H01L 25/0652; H01L 25/112; H01L 25/115; H01L 23/48; H01L 23/481; H01L 23/482; H01L 23/49827; H01L 23/52; H01L 23/5226; H01L 23/5286; H01L 23/535; H01L 23/538; H01L 23/5384; H01L 33/08; H01L 33/18; H01L 33/20; H01L 33/36; H01L 33/38; H01L 33/382; H01L 33/385; H01L 33/387; H01L 33/647; H01L 31/14; H01L 31/141; H01L 31/143; H01L 31/153; H01L 31/16; H01L 31/101; H01L 31/107; H01L 31/00; H01L 31/0232; H01L 31/02024; H01L 31/0224; H01L 31/022408; H01L 31/125; H01L 31/02005; H01L 31/02002; H01L 31/02016; H01L 31/0201; H01L 31/02013; H01L 31/0203; H01L 31/12; H01L 31/02325; H01L 31/02327; H01L 31/035281; H01L 31/035236; H01L 31/02322; H01L 31/035209; H01L 31/054; H01L 31/048; H01L 31/167; H01L 31/173; H01L 31/206; H01L 27/1469; H01L 27/156; H01L 25/073; H01L 23/02; H01L 23/04; H01L 23/041; H01L 23/043; H01L 23/053; H01L 23/057; H01L 23/3107; H01L 23/495; H01L 23/49524; H01L 23/49531; H01L 23/49541; H01L 23/498; H01L 23/49838; H01L 33/0025; H01L 33/0095; H01L 33/0075; H01L 33/48; H01L 33/483; H01L 33/486; H01L 33/60

USPC ..... 257/13, 79, 89, 88, 93, 98, 99, E33.008, 257/E33.066, E33.011; 438/28, 29, 34, 438/42

See application file for complete search history.

(56) References Cited

U.S. PATENT DOCUMENTS

| | | | |
|---|---|---|---|
| 7,201,511 B2* | 4/2007 | Moriyama | F21K 9/00 257/668 |
| 8,842,255 B2* | 9/2014 | Yoo | H01L 33/58 313/111 |
| 9,671,490 B2* | 6/2017 | Brandl | H01L 25/167 |
| 2003/0067502 A1 | 4/2003 | Arquilevich et al. | |
| 2006/0071150 A1* | 4/2006 | Aizpuru | G01D 5/342 250/214.1 |
| 2009/0154156 A1* | 6/2009 | Lo | H05B 45/00 362/234 |
| 2010/0072509 A1* | 3/2010 | Huang | H01L 23/49537 257/99 |
| 2011/0031509 A1* | 2/2011 | Kirihara | H01L 24/97 257/81 |
| 2011/0222280 A1* | 9/2011 | Kim | H01L 33/58 362/235 |
| 2011/0297831 A1 | 12/2011 | Yao et al. | |
| 2012/0080674 A1 | 4/2012 | Shimizu et al. | |
| 2012/0086018 A1 | 4/2012 | Yao et al. | |
| 2012/0292660 A1 | 11/2012 | Kanno | |
| 2013/0105822 A1 | 5/2013 | Wang et al. | |
| 2014/0103371 A1* | 4/2014 | Moon | H01L 25/0753 257/88 |
| 2015/0034804 A1 | 2/2015 | Lee | |
| 2015/0226839 A1 | 8/2015 | Brandl et al. | |
| 2016/0240721 A1* | 8/2016 | Chu | H01L 25/167 |
| 2017/0325729 A1* | 11/2017 | Halbritter | A61B 5/14552 |

FOREIGN PATENT DOCUMENTS

| | | |
|---|---|---|
| EP | 2381474 A2 | 10/2011 |
| EP | 2829918 A1 | 1/2015 |

* cited by examiner

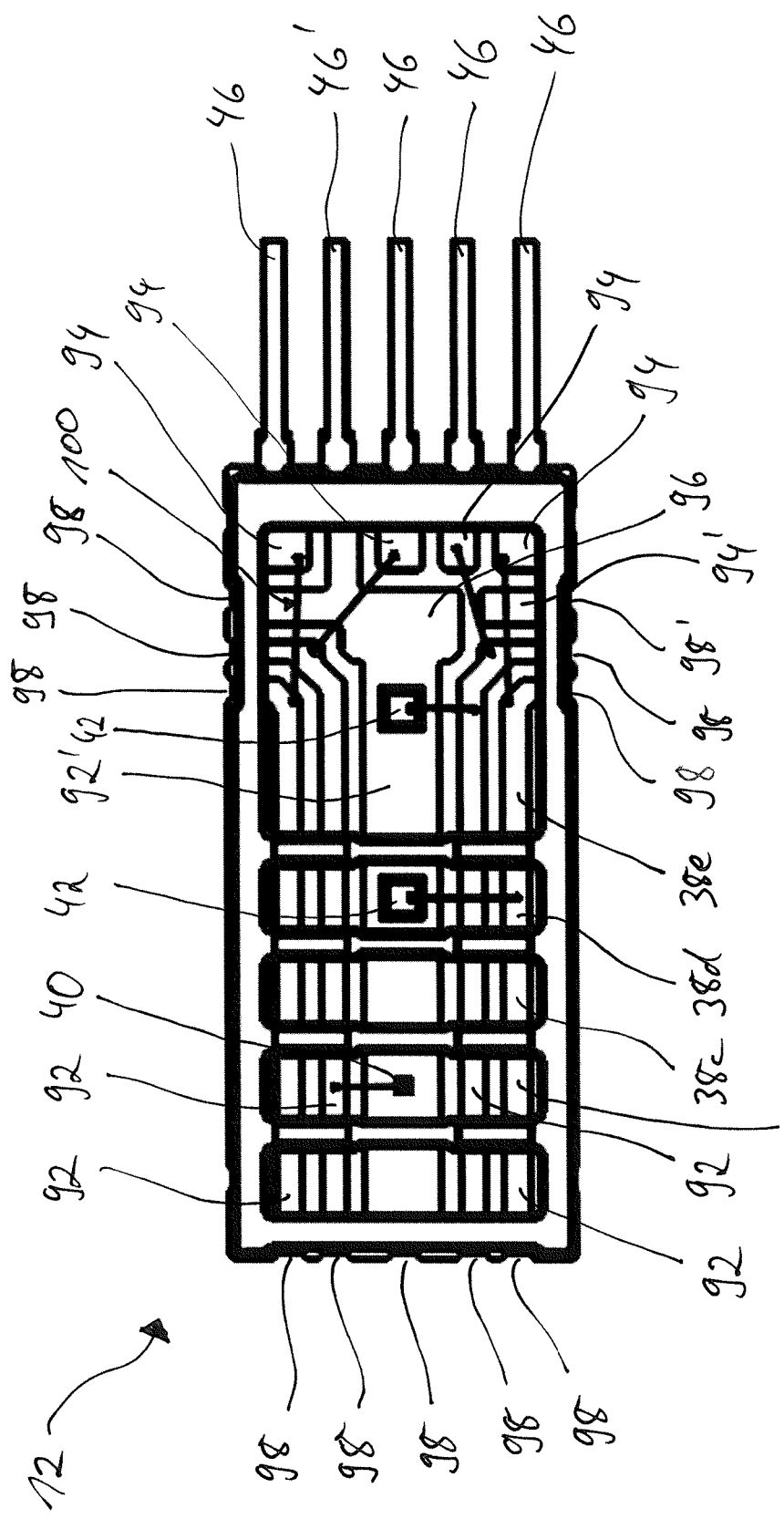

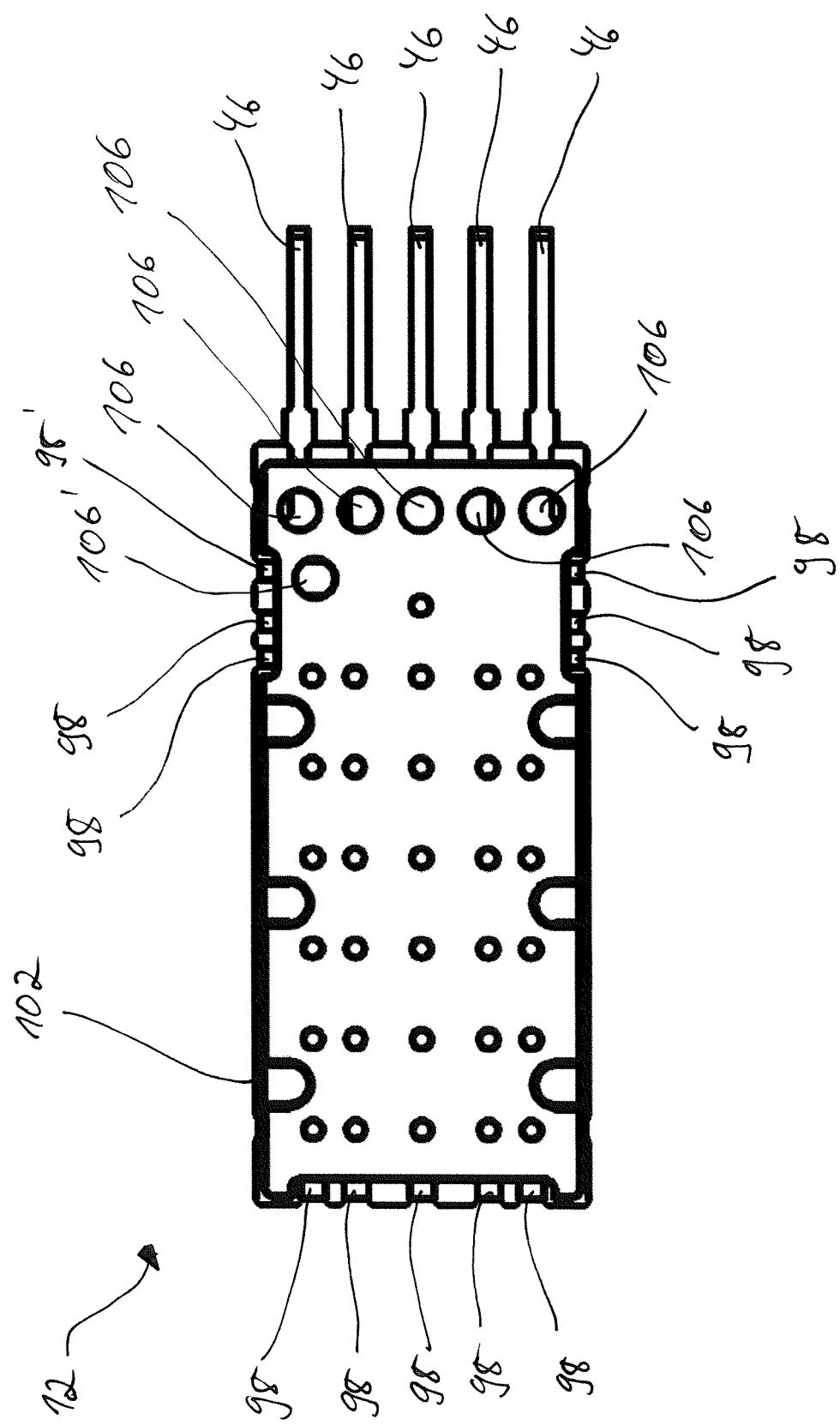

OPTOELECTRONIC APPARATUS

CROSS REFERENCE TO RELATED APPLICATION

This application is a § 371 application of International Application No. PCT/EP2017/054075, filed Feb. 22, 2017, which is incorporated by reference as if fully set forth.

FIELD OF INVENTION

The present invention relates to an optoelectronic apparatus having a carrier device. The carrier device is provided to receive and to electrically contact electronic components or units, in particular an optoelectronic transmitter and/or receiver, required for an operation of the apparatus in accordance with an application.

BACKGROUND

A lens element that has at least one lens section for an optoelectronic transmitter and/or for an optoelectronic receiver can be provided above the carrier device, i.e. above an optoelectronic transmitter and/or receiver with respect to a vertical direction. For this purpose, the respective lens section can have beam-shaping and/or beam-deflecting properties.

Such optoelectronic apparatus are in particular configured as optoelectronic sensor apparatus to be able to optically scan and electronically detect properties of objects. An application for such sensor apparatus is in the sector of commercially available printer devices, i.e. apparatus for a computer-assisted printing of paper by means of known printing technologies, e.g. laser printing technology or inkjet printing technology. To allow an operation of a printer (or of a multifunctional device comprising a printer) that is as fully automatic and as user-friendly as possible, different operating parameters of the printer such as a quantity or a type of the paper placed into the reception tray of the printer, a provided paper format, the relative position of a paper edge and the like are determined and are monitored as necessary. There is furthermore a need for an automatic analysis of a respective print result or of a paper to be scanned in order e.g. to check the content type (image vs. text) of the paper to be scanned or the correct configuration (e.g. mechanical alignment of a printing unit of the printer) with reference to a print result.

An individually adapted optoelectronic apparatus is typically provided for each operating parameter to be measured and is configured to compare an emitted optical signal with a detected, e.g. reflected, optical signal to be able to determine the respective operating parameter from the difference of these optical signals. The optical signals are generally electromagnetic radiation of a visible or non-visible wavelength, in particular infrared. The apparatus frequently comprises both an optoelectronic transmitter and (at least) one optoelectronic receiver. The apparatus can thus, for example, act as a proximity sensor. Variants are, however, also possible in which an optoelectronic apparatus only has an optoelectronic transmitter or only an optoelectronic receiver (for a passive detection). Apparatus having a plurality of transmitters and receivers are furthermore possible, with an apparatus e.g. being able to determine, in particular simultaneously, a plurality of operating parameters (e.g. by a distinction between diffuse and reflective reflection).

Due to the large number of operating parameters to be measured, a corresponding variety of optoelectronic apparatus is required, which is associated with an unwanted cost effort in manufacture and storage. Furthermore, an optoelectronic apparatus for measuring a respective operating parameter has to have a specific carrier device that may differ greatly in dependence on the respective operating parameter and requires a high development effort in this respect. The carrier device has to be adapted to the optoelectronic components, for example. The geometrical design of the carrier device and the division of contacting surfaces thereof thus, for instance, have to take place in dependence on the respective required position of the respective components relative to a lens element arranged above the carrier device. The components to be installed, but in particular also the number of components, are/is frequently very different, which further increases the adaptation effort with respect to the carrier device.

SUMMARY

It is an object of the invention to provide a carrier device that can be equipped simply and variably with different optoelectronic components to be able to manufacture an optoelectronic apparatus adapted to an individual application, but without the carrier device having to be changed for this purpose.

The object is satisfied by an optoelectronic apparatus having the features of claim 1 and in particular in that the carrier device of the optoelectronic apparatus has a longitudinal extent and a transverse extent, with the carrier device having a plurality of electrically conductive contact tracks aligned in parallel with the longitudinal extent and with the carrier device having contact chambers aligned in parallel with the transverse extent at an upper side. Each of the contact tracks is electrically contactable in each of the contact chambers so that at least one optoelectronic transmitter and/or at least one optoelectronic receiver can be installed in the respective contact chamber in a variable mounting.

The carrier device of the optoelectronic apparatus is divided into a plurality of electrically conductive contact tracks and into a plurality of contact chambers in mutually different directions to be able to equip the carrier device individually with optoelectronic components or units and to be able to contact the optoelectronic components individually electrically. The contact tracks are separated from one another, and thus electrically insulated from one another, along the transverse extent of the carrier device. Each of the contact tracks is exposed at least sectionally in each of the contact chambers or is otherwise accessible to allow an electrical contacting.

The division into a plurality of contact chambers allows an optical isolation of the optoelectronic components to prevent optical crosstalk. The contact chambers are separated or delineated from one another along the longitudinal extent of the carrier device and are preferably peripherally defined, but are open at the upper side. Each of the contact chambers represents an at least functionally uniform installation region of the carrier device so that the carrier device can be equipped in a simple and flexible manner with a plurality of optoelectronic components that can in particular be operated independently of one another. It is a particular advantage of the invention that each of the named plurality of contact tracks is electrically contactable in each of the named plurality of contact chambers. The flexibility of the mounting is hereby particularly high. On the one hand, a component to be installed in a respective contact chamber can be locally flexibly connected to one or more of the contact tracks, with no larger distances, in particular between adjacent contact chambers, having to be bridged for this purpose. The position of a component to be installed can furthermore be selected flexibly since the component can in principle be installed equally easily in every contact chamber. The carrier device is thus suitable for almost any desired equipping topology and can thus be used in a universal manner. An adaptation of the carrier device to a desired equipping technology is not necessary in this respect. The same carrier device can thus be used to adapt the optoelectronic apparatus to a variety of individual applications.

In the context of the invention, an optoelectronic component or an optoelectronic unit is in particular to be understood as an optoelectronic transmitter and/or as an optoelectronic receiver.

The number of contact chambers can be adapted to the application cases provided for the optoelectronic apparatus. A plurality of contact chambers of the same type are in particular preferably arranged behind one another in the longitudinal direction of the optoelectronic apparatus. Individual contact chambers or a plurality of contact chambers can, however, also be formed differently. For example, one contact chamber can be larger than the others to be able to install a plurality of or larger electronic components in the enlarged contact chamber.

The carrier device can, for example, have three, four, five or six contact tracks. The carrier device can accordingly have three, four, five or six contact chambers, for example. In special application cases, more than six contact tracks and/or contact chambers per carrier device are also possible. In this respect, the number of contact tracks can correspond to the number of contact chambers or can differ at most by the number one or at most by the number two. A number of contact chambers corresponding to the number of contact tracks is generally advantageous since the carrier device can hereby be equipped particularly variably, i.e. flexibly. Different numbers of contact tracks, on the one hand, and contact chambers, on the other hand, can in particular be sensible when the same contact track is used for contacting a plurality of optical components in different contact chambers, for example as a mass contact or with a parallel connection of the respective optoelectronic components. Different numbers of contact tracks, on the one hand, and contact chambers, on the other hand, can in particular also be sensible when contact tracks are necessary for electronic components that are not optoelectronic components and can therefore be installed within the same contact chamber as one of the optoelectronic components.

The contact chambers are preferably optically isolated from one another so that an optoelectronic component installed in a respective contact chamber can at least optically be operated independently of a component installed in an adjacent contact chamber. The contact chambers can in particular be separated from one another by partition webs that extend in parallel with the transverse extent of the optoelectronic apparatus. The partition webs can thus also be called partition walls. The partition webs can form elevated portions with respect to a plane of extent of the electrically conductive contact tracks. The partition webs can be formed from a light-impermeable material or can be covered at least sectionally by a light-impermeable coating. The partition webs can be formed, for example, from plastic and/or by injection molding. Optical crosstalk between adjacent contact chambers can hereby be effectively suppressed.

The contact chambers can be filled with a casting material, in particular with an epoxy resin, a silicone or the like. The optical refractive index can hereby be changed or adapted; a spectral filtering can take place; and/or the optoelectronic component provided in the respective contact chamber can be protected from environmental influences. The different contact chambers can be filled in different manners with casting material or can be not filled.

In accordance with an embodiment, the carrier device has an overmolded lead frame. Such a lead frame is also called a "pre-molded lead frame". The overmolded lead frame comprises a segmented (i.e. sectionally interrupted) and at least sectionally electrically conductive lead strip of metal. This lead strip can be a stamped part or a stamped bent part that has been segmented, i.e. provided with recesses, by a stamping process (in particular before the overmolding with plastic). A plurality of separate parts that in particular comprise the named contact tracks and/or additional elements can hereby be formed from a single lead strip, with these separate parts being able to be arranged within a common plane of extent or within planes of extent offset with respect to one another. The mutually separate parts of the lead strip or electronic components installed hereat can be electrically connected to one another by bonding wires, for example.

The lead strip of metal can be partly surrounded by a frame section of plastic, with the frame section defining the plurality of contact chambers at an upper side of the lead strip. The frame section can comprise the named partition webs and can, just like them, be formed from a light-impermeable material or can be at least sectionally covered by a light-impermeable layer. The frame section can furthermore form an outer frame that surrounds the upper side of the lead strip sectionally or completely at the periphery.

The conductor strip of metal can form at least one electrical connector for a respective contact track to be able to electrically contact the respective contact track or a component electrically connected thereto from outside the optoelectronic apparatus. The electrical connector can in particular be formed by a segmented part of the lead strip. At least one electrical connector is preferably provided for each contact track. A plurality of differently formed and/or mutually spaced apart electrical connectors can in particular be provided. The use of parts of a lead frame not only as contact tracks, but also as electrical connectors has the advantage of a particularly simple and compact design, in particular in comparison with a carrier device that is based on a printed circuit board (PCB) or on a ceramic substrate.

The respective electrical connector can form an elastic contact tongue to ensure a reliable contacting of an electrical plug-in connector that cooperates with the contact tongue and that is connected to the optoelectronic apparatus from the outside. The contact tongue can be arched. The contact tongue is in this respect preferably aligned in parallel with the longitudinal extent of the carrier device. The respective contact tongue can in particular extend away from a narrow side of a rectangular basic shape of the carrier device. An arrangement of the electrical connector at the narrow side is advantageous to form the carrier device and the optoelectronic apparatus in a compact manner in the sense of an outer shape that is as slim as possible.

The metal used for the lead strip and in particular for the electrical connector or a coating thereof can comprise a nickel-palladium alloy. This has the advantage, on the one hand, that an optoelectronic component to be installed in a contact chamber can easily be electrically connected to a contact track of the lead strip (by means of conventional bonding processes). At the same time, the electrical connector has an ideal flexibility, in particular when it is formed as a contact tongue, by the use of the nickel-palladium alloy such that the named contacting capability is particularly easily ensured by an associated plug-in connector and the break sensitivity of the electrical connector is minimal. A respective electrical connector or a contact track can furthermore be contacted/decontacted multiple times without impairing the reliability of the respective electrical contact.

It is understood that the conductor strip can form a plurality of electrical connectors, with the plurality of connectors being able to the same or different. A plurality of electric contact tongues of the explained kind can in particular be provided.

In accordance with an embodiment, the plurality of electrical connectors of the lead strip together form a contacting zone for an electrical plug-in connector that is connected to the optoelectronic apparatus from the outside. The optoelectronic apparatus can e.g. have a free space above the contacting zone by which a bushing is formed for introducing and fixing the electrical plug-in connector. The plurality of electrical connectors are preferably arranged in parallel with one another such that a contacting is possible in the manner of a flat flexible cable. A separate bushing is not necessary. The carrier device can thus be connected in a particularly simple and compact manner to an external microcontroller to be able to operate the optoelectronic apparatus.

In accordance with an embodiment, at least one of the plurality of electrical connectors is electrically insulated from the plurality of contact tracks. This can in particular take place in that the electrical connectors and the contact tracks form separate parts of a segmented lead strip. The respective electrical connector can, however, selectively be directly connected to a respective contact track (for example by means of a bonding wire), which even further increases the flexible equipping capability of the carrier device, e.g. with optoelectronic transmitters and/or receivers. Alternatively or additionally, an indirect electrical connection can be provided, in particular via an electronic component, such as an application-specific integrated circuit (ASIC) installed in a contact chamber of the carrier device.

In accordance with a further embodiment, at least one of the plurality of electrical connectors is formed integrally (i.e. in one part) with one of the plurality of contact tracks and is hereby also electrically connected. One of the plurality of electrical connectors can in particular be directly connected to an installation contact track of the carrier device and can preferably be formed integrally.

This installation contact track can in particular be a contact track arranged centrally along the transverse extent. The installation contact track can e.g. be connected to a predefined electrical potential, in particular to ground (zero potential) via the electrical connector. All the electronic components (optoelectronic transmitters and/or receivers and ASICs) installed at the carrier device are preferably fastened to the installation contact track, with at least some of the installed components also being able to electrically contact the installation contact track. In addition, each installed component can be electrically connected to one or more of the other contact tracks by means of bonding wires.

In accordance with a further embodiment, the installation contact track can be broadened relative to the other contact tracks, i.e. it has a greater extent along the named transverse extent of the carrier device. Larger electronic units can thus also be reliably installed on the installation contact track. If all the electronic units are installed on the installation contact track, the other contact tracks can be comparatively narrow so that the optoelectronic apparatus can be compact overall.

The contact tracks can each have a substantially uniform width that is in particular unchanging over the longitudinal extent. The geometry can, however, differ sectionally. The installation contact track, that is preferably centrally arranged, can in particular have an increased, in particular broadened, region at which an ASIC can e.g. be installed. All the other contact tracks preferably run locally at the enlarged region of the installation contact track so that an ASIC installed at this region can be contacted to each of the other contact tracks with only a small wiring effort. The distance to be bridged by a respective bonding wire is in this respect comparatively small so that the respective bonding connection can be established reliably and simply and is comparatively durable and so that electromagnetic interference influences can also not be easily coupled in.

It is understood that other electronic components can also be installed on the carrier device in addition to the named electronic components. For example, a temperature sensor can thus be provided in order, for example, to be able to detect an excessive heating of the optoelectronic apparatus. The temperature sensor can in particular be integrated into an ASIC on the carrier device.

At least one contacting region, in which a respective one of the plurality of contact tracks for an electrical contacting is exposed, can be provided at a lower side of the carrier device. A simple electrical contacting of the respective contact track can hereby take place as part of a manufacturing process of the carrier device or of the optoelectronic apparatus independently of the named electrical plug-in connector that is provided for an electrical contacting in a normal operation of the optoelectronic apparatus. This can be desired, for example, to test, to calibrate or to finally program, the carrier device or the optoelectronic apparatus. One of the contacting regions at the lower side can in particular form a so-called fuse pad to directly destroy electrical connections within the optoelectronic apparatus and in particular within an ASIC installed hereat by applying a predefined increased voltage.

The lead strip can furthermore have at least one lateral contacting region in which a respective one of the plurality of contact tracks is exposed for an electrical contacting. A contact track can in particular be led out of the frame section at two mutually spaced apart lateral sections of the carrier device. A respective end section of a contact track can, for example, be formed by a lateral contacting region. The conductivity of the contact track can thus e.g. be checked in a simple manner within the framework of an automatic test cycle.

In accordance with a preferred embodiment, the optoelectronic apparatus has a lens element and a holding device, with the lens element being provided above the carrier device and has at least one lens section for the at least one optoelectronic transmitter and/or for the at least one optoelectronic receiver, and with the holding device holding the carrier device and the lens element relative to one another. A lens element is to be understood in connection with the invention as an imaging element that can in particular have refractive properties. The respective lens section can have beam-shaping properties, in particular in that the respective lens section has an arch at one side or at two sides (e.g. as a converging lens, a diverging lens or as a Fresnel lens). Alternatively or additionally hereto, the respective lens section can effect a deflection of beams, i.e. a change in the direction of propagation of emitted or received beams. The respective lens section can in particular have a wedge shape (e.g. design as a wedge lens having two planar surfaces aligned at an acute angle with one another). The respective lens section can be aligned in parallel with or obliquely to a plane of extent of the carrier device. The lens element can be of plate shape outside the respective lens section. The respective lens section can be formed integrally and/or above the optoelectronic transmitter or receiver.

The optoelectronic apparatus is characterized by a modular design in which the apparatus is assembled in the manner of a module system from different, separate components. These separate components comprise at least the carrier device, the lens element and the holding device. The individual components are preferably releasably connected to one another or held at one another. The components can in particular be held at one another in a force-transmitting and/or shape-matched manner. The components can be arranged substantially behind one another along the named vertical direction (e.g. in a sandwich structure). Different variants of the carrier device and of the lens element as well as optional components can hereby be combined with one another on the basis of a universal modular platform to produce different optoelectronic apparatus, with some components of the different optoelectronic apparatus being able to be the same (e.g. the holding device).

The holding device serves to hold at least the carrier device and the lens element relative to one another, with an alignment of the lens element with respect to the carrier device being maintained, with the latter being equipped with the at least one optoelectronic transmitter and/or receiver. In this respect, the holding device can secure and/or fix the lens element directly or indirectly at the carrier device. The holding device can for this purpose, for example, have a clip or at least a clip-like element that at least engages around or engages behind the carrier device and the lens element. Additionally or alternatively, the holding device can be formed in the manner of a housing or of a cage, with such a holding device not having to completely surround the carrier device and the lens element, in particular not over the whole surface and also not at every side of the apparatus. The holding device can thus serve at least functionally as a housing of the apparatus or can even be a real, at least predominantly closed housing, with at least a mechanical encapsulation of the components of the apparatus being ensured.

The holding device can in particular have a base plate having a plurality of side walls and/or having a plurality of, in particular two, four or six, holding arms or holding sections disposed opposite one another pairwise. The base plate can have a uniform plate size that is e.g. adapted to the shape and size of the carrier device and/or of the lens element. The apparatus can hereby be robust and compact, with an adhesion or penetration of dirt and the like on or into the apparatus respectively being avoided. The base plate is preferably arranged at a lower side of the carrier device and forms a bottom section. The holding device can have an at least sectionally step-shaped and/or U-shaped cross-section or a plurality of openings such that a component of the apparatus that is placed into the holding device and that is formed at least sectionally complementary to the holding device, is captured laterally and/or in the vertical direction in the holding device without separate fastening means being required for this purpose.

The optoelectronic apparatus can furthermore have at least one aperture element that is provided above the carrier device and has at least one aperture section for the at least one optoelectronic transmitter and/or for the at least one optoelectronic receiver. The aperture element can in particular effect a geometrical restriction of beams detected by the optoelectronic receiver.

The holding device can in particular be in two parts, with the holding device comprising a lower part and an upper part. In this respect the carrier device and the lens element can e.g. be captured between the lower part and the upper part of the holding device. The lower part and the upper part of the holding device are in particular fastened to one another by means of a latch connection.

The upper part of the holding device can form at least one aperture section for the at least one optoelectronic sensor and/or for the at least one optoelectronic receiver.

Alternatively to a two-part holding device, it can also be formed in one piece and have an open upper side, with the lens element or the aperture element being arranged at the upper side of the holding device.

The invention further relates to a system having a plurality of optoelectronic apparatus in accordance with any one of the above-described embodiments, with the contact chambers of at least some of the plurality of optoelectronic apparatus being equipped in different configurations with a respective at least one optoelectronic transmitter and/or with at least one optoelectronic receiver. The named modular system can hereby be implemented.

Each of the plurality of optoelectronic apparatus can have a respective lens element that is provided above the carrier device and has at least one lens section for the at least one optoelectronic transmitter and/or for the at least one optoelectronic receiver, with the lens elements of at least some of the plurality of optoelectronic apparatus differing with respect to their respective shapes from the lens elements of other ones of the plurality of optoelectronic apparatus.

The plurality of optoelectronic apparatus can furthermore respectively have a holding device that holds the carrier device and the lens element of the respective optoelectronic apparatus relative to one another.

The system can be configured such that each of the plurality of optoelectronic apparatus has at least one aperture element that is provided above the carrier device and has at least one aperture section for the at least one optoelectronic transmitter and/or for the at least one optoelectronic receiver, with the aperture elements of at least some of the plurality of optoelectronic apparatus differing with respect to their respective arrangements and/or shapes from the other ones of the plurality of optoelectronic apparatus.

BRIEF DESCRIPTION OF THE DRAWING(S)

The invention will be described in the following purely by way of example with reference to the drawings, in which.

Figure 1:
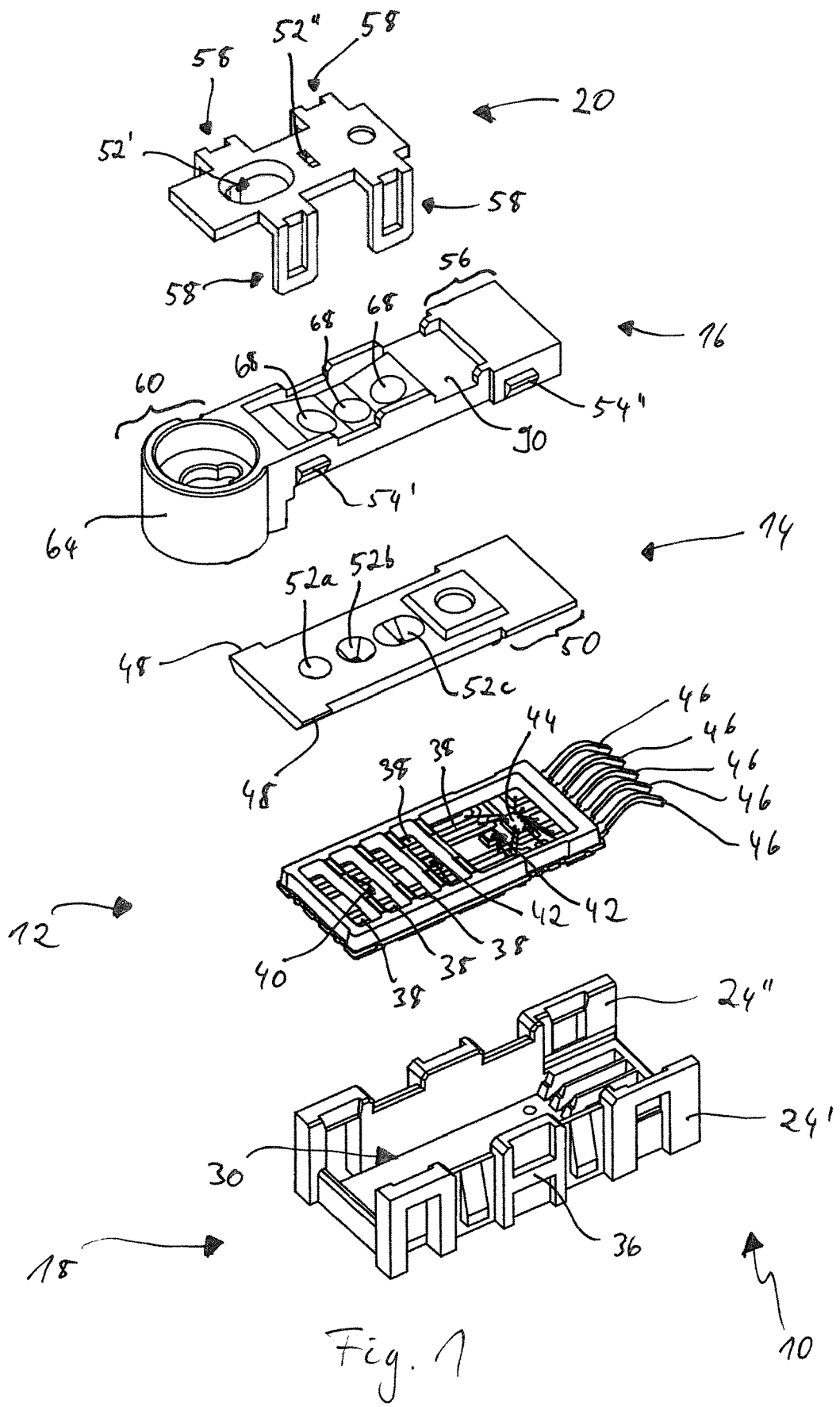
FIG. 1 is an exploded representation of an embodiment of an optoelectronic apparatus.
Figure 5:
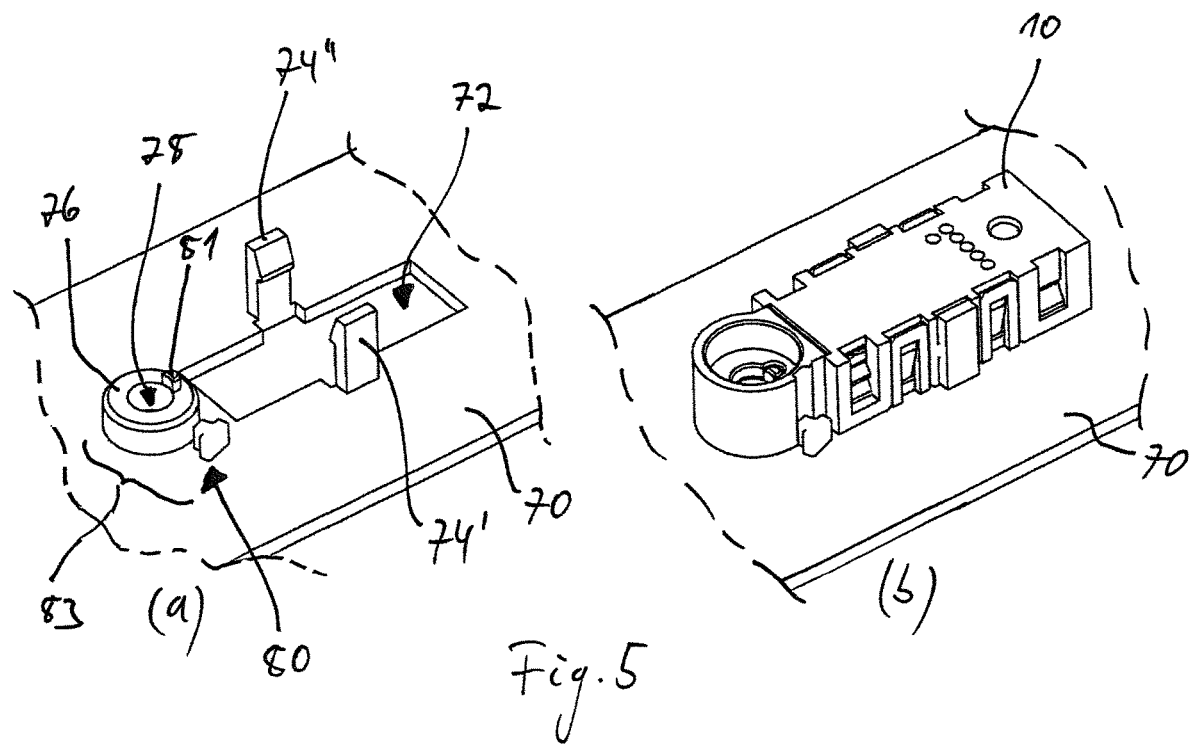
Figure 6:
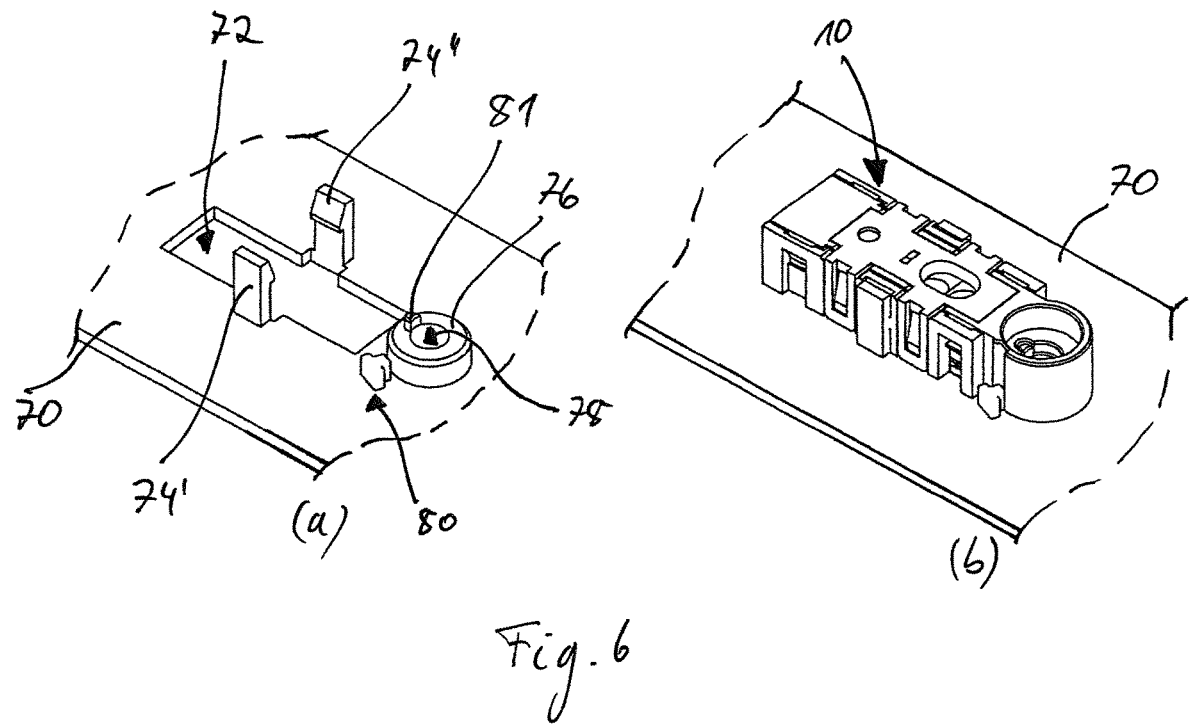
Figure 7:
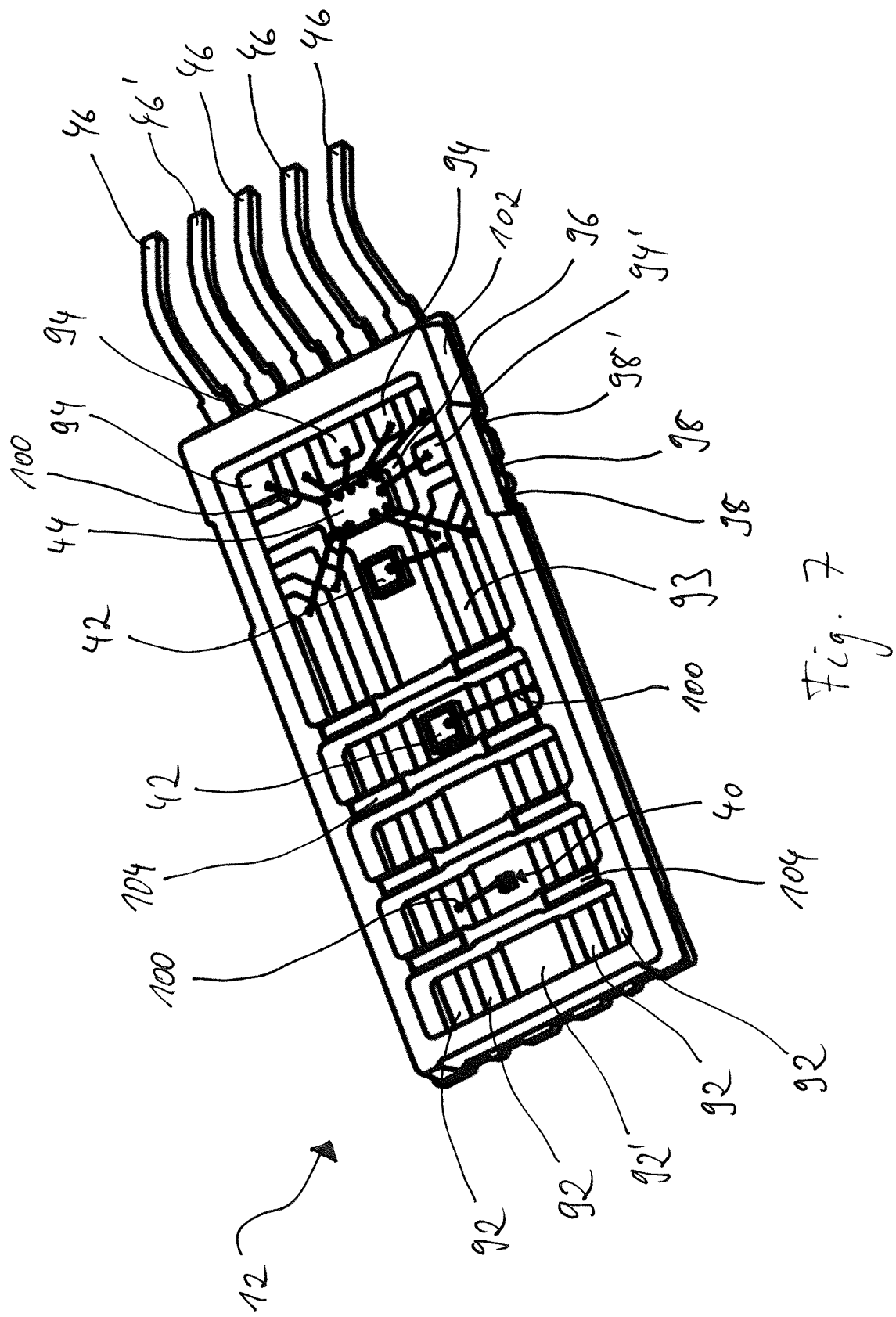

FIG. 5 comprises two perspective views of an installation site for an apparatus in accordance with FIG. 1, (a) without an installed apparatus and (b) with an installed apparatus;

FIG. 6 comprises two perspective views of a further installation site for an apparatus in accordance with FIG. 1, (a) without an installed apparatus and (b) with an installed apparatus;

FIG. 7 is a perspective view obliquely from above of a carrier device for the apparatus of FIG. 1;

FIG. 8 is a perspective view obliquely from above of a carrier device for the apparatus of FIG. 1; and FIG. 9 is a plan view from below of the carrier device of FIG. 1, FIG. 7 and FIG. 8.

The same or similar elements in the drawings are marked by the same reference numerals.

DETAILED DESCRIPTION OF THE PREFERRED EMBODIMENTS

An optoelectronic apparatus 10 comprises a substantially plate-shaped carrier device 12, a first aperture element 14, a lens element 16 and a holding device comprising a lower part 18 and an upper part 20. The upper part 20 of the holding device simultaneously forms a second aperture element of the optoelectronic apparatus 10 in the embodiment shown here. All of these components are shown obliquely from above in FIG. 1, i.e. the perspective is directed obliquely to a respective upper side of the components.

How the apparatus 10 is assembled will be described in the following, with the individual components of the optoelectronic apparatus 10 being explained in more detail.

Figure 2:
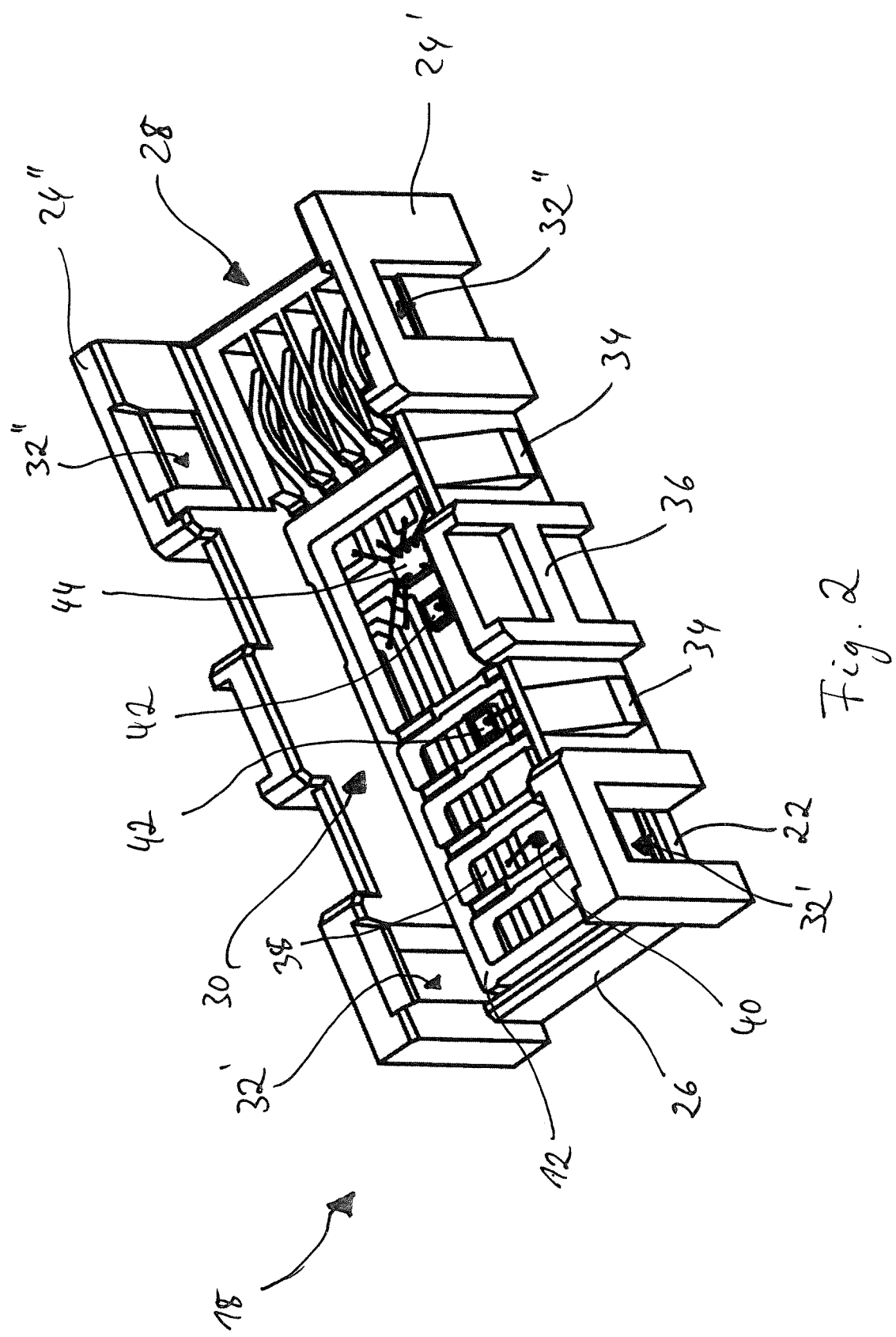
FIG. 2 is a perspective view of components of the apparatus of FIG. 1.

The carrier device 12 is first placed into the lower part 18. The lower part 18 with the inserted carrier device 12 is shown in FIG. 2, with the scale in FIG. 2 being enlarged with respect to FIG. 1. The lower part 18 has a bottom section 22 having a plurality of connection sections protruding upwardly therefrom. In detail, two side parts 24', 24" that are specularly symmetrical with respect to the longitudinal extent of the lower part 18 extend upwardly away from the bottom section 22, with the side parts 24', 24" being aligned substantially perpendicular to the bottom section 22. The bottom section 22 furthermore has an end face catch 26 as well as a meshing section 28. The lower part 18 formed in U shape in this manner has a receiving space 30 completely upwardly open and partly laterally open for receiving the carrier device 12, the first aperture element 14, and the lens element 16. The size and shape of the receiving space 30 sectionally substantially correspond to the size and shape of the carrier device 12, of the aperture element 14 and of the lens element 16. The components 12, 14 and 16 can thus be placed into the lower part 18 with an exact fit.

The side parts 24', 24" each have two rectangular openings 32' and 32" as well as two mutually spaced apart latching noses 34 at the outer side. The side parts 24', 24" furthermore each have a centrally arranged latching catch 36 at the outside. The receiving space 30 is broadened with respect to the central region in the region of the meshing section 28.

The carrier device 12 is formed as a lead frame that has a segmented lead strip 39 of metal overmolded with plastic (a so-called "pre-molded lead frame) and that can be variably equipped. The periphery of the carrier device 12 is complementary to the receiving space 30 of the lower part 18 such that the carrier device 12 can be placed into the lower part 18 as shown in FIG. 2, with the carrier device 12 being laterally captured in the plane of the bottom section 22 between the catch 26, the meshing section 28 and the side parts 24', 24". The upper side of the carrier device 12 is divided into a plurality of contact chambers 38 in the longitudinal direction, with an optoelectronic transmitter or an optoelectronic receiver generally being able to be attached and electrically contacted in each contact chamber 38. The carrier device 12 shown in FIG. 1 has an optoelectronic transmitter 40, two optoelectronic receivers 42 and an ASIC 44 (application-specific integrated circuit). To connect the carrier device 12 to an external microcontroller (not shown), a plurality of electrical connectors 46 are provided that extend away from the carrier device 12 in a uniform arcuate shape as a respective contact tongue at a narrow side of the carrier device 12. If the carrier device 12 is placed into the lower part 18, the connectors 46 resiliently engage into the meshing section 28 of the lower part 18, whereby a flexible contacting zone is formed for contacting an electrical plug-in connector, in particular a flat flexible cable (not shown), introduced into a free space of the apparatus 10 (FIG. 2).

Once the carrier device 12 has been placed into the lower part 18, the first aperture element 14 is placed into the reception space 30 of the lower part 18, not shown. In this respect, a respective lateral projection 48 of the first aperture element 14 engages into a respective opening 32', 32" of the side parts 24', 24" (FIG. 1 and FIG. 2). Furthermore, a broadened region 50 of the first aperture element 14 engages into the receiving space 30 broadened in the region of the meshing section 28. In this manner, the first aperture element 14 is in particular not displaceable in the longitudinal direction of the apparatus 10 and is secured to the lower part 18 in this respect. The first aperture element 14 in FIG. 1 furthermore has three differently formed aperture sections 52a, 52b and 52c that are arranged behind one another in the longitudinal direction at the first aperture element 14 and are formed by openings bordered in a substantially frustoconical shape.

Next, the lens element 16 is placed into the reception space 30 of the lower part 18, with a respective lateral projection 54', 54" engaging into a respective opening 32', 32" of the side parts 24', 24". Furthermore, a broadened region 56 of the lens element 16 engages into the region of the receiving space 30 broadened in the region of the meshing section 28. The lens element 16 is in this manner fixed to the lower part 18 in the longitudinal and transverse direction in a plane in parallel with the bottom section 22.

Finally, the upper part 20 of the holding device is fastened by means of a latching connection to the lower part 18, with the upper part 20 for this purpose having four downwardly protruding latching tabs 58 that each latch with one of the latching noses 34 of the side parts 24', 24". The carrier device 12, the aperture element 14 and the lens element 16 are now completely captured and fixed to one another between the upper part 20 and the lower part 18. The lower part 18 of the holding device, the carrier element 12, the aperture element 14, the lens element 16 and the upper part 20 of the holding device are thus arranged behind one another along a vertical direction.

Figure 3:
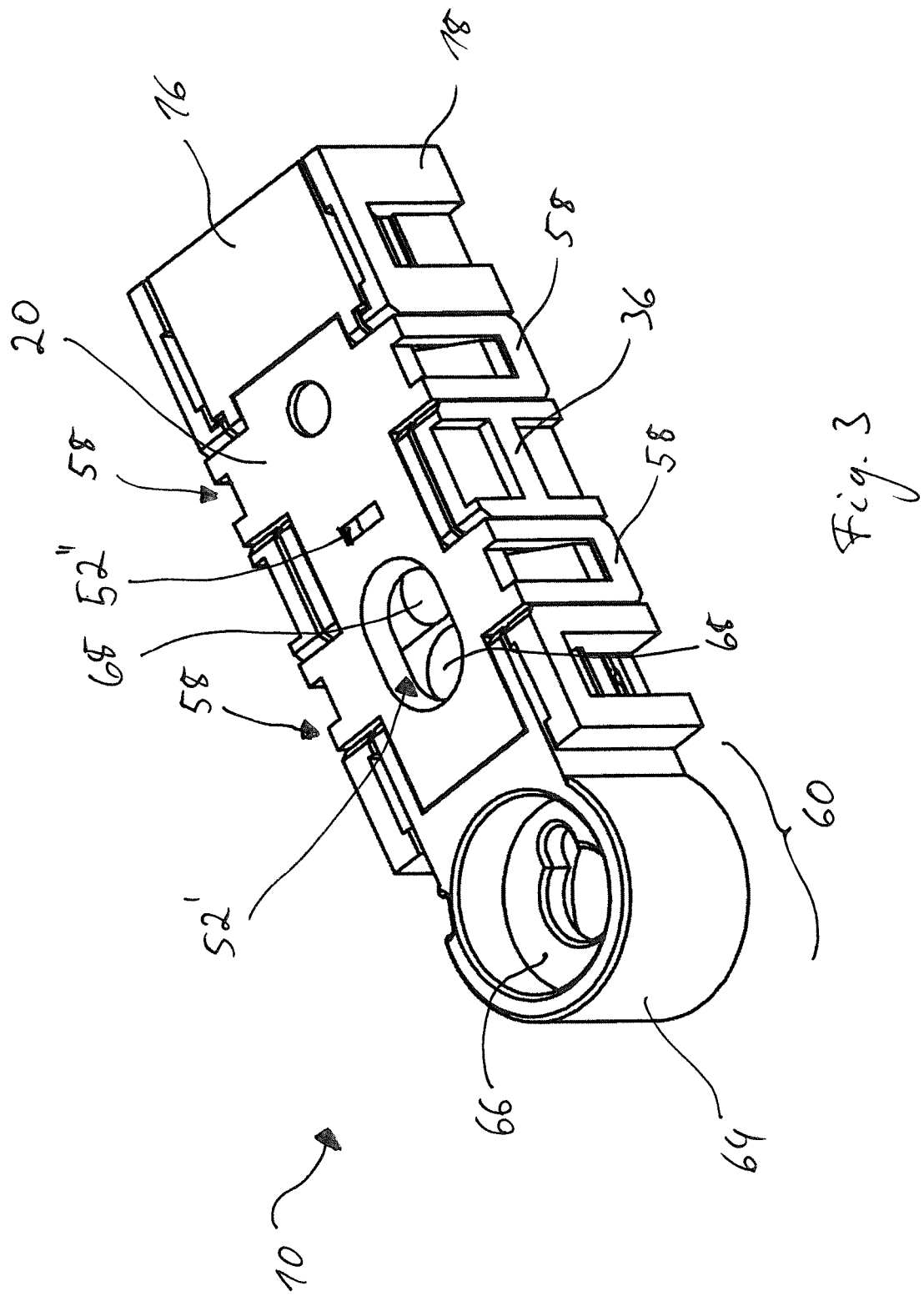
FIG. 3 is a perspective view of the apparatus of FIG. 1 in an assembled state.

The apparatus 10 assembled in this manner is shown in perspective in FIG. 3. The upper part 20 (second aperture element) has two aperture sections 52', 52" (cf. FIG. 1 and FIG. 3). It can furthermore be recognized that the upper part 20 engages into a complementary engagement section 90 of the lens element 16 (cf. FIG. 1) such that the upper part 20 ends in alignment with the lens element 16 and a substantially smooth upper side of the apparatus 10 is formed. The lens element 16 is furthermore additionally fixed and the size of the apparatus 10 is kept small.

The optical properties of the optoelectronic apparatus 10 are fixed by the three aperture sections 52a, 52b and 52c of the first aperture element 14 in combination with the two aperture sections 52', 52" of the second aperture element or of the upper part 20 and unwanted interference influences are suppressed in that a geometrical restriction of the respective cross-section of the emitted or received beams takes place.

The apparatus 10 has a slim, substantially parallelepiped base body, with the outer skin of the apparatus being characterized by surfaces that substantially end in alignment with one another. The latching tabs 58 in particular end in alignment with the outer side of the side parts 24', 24".

The substantially plate-shaped lens element 16 has a integrally formed mechanical encoding section 60 that extends away from the otherwise plate-shaped lens element 16 in the longitudinal direction (FIG. 1). The ring-shaped coding section 60 has a hollow cylinder 64 that protrudes perpendicular from a plane of extent of three lens sections 68 of the lens element 16 arranged behind one another in the longitudinal direction. The lens sections 68 of the lens element 16 have beam-shaping properties and can, for example, comprise convex lenses, biconvex lenses or Fresnel lenses.

Figure 4:
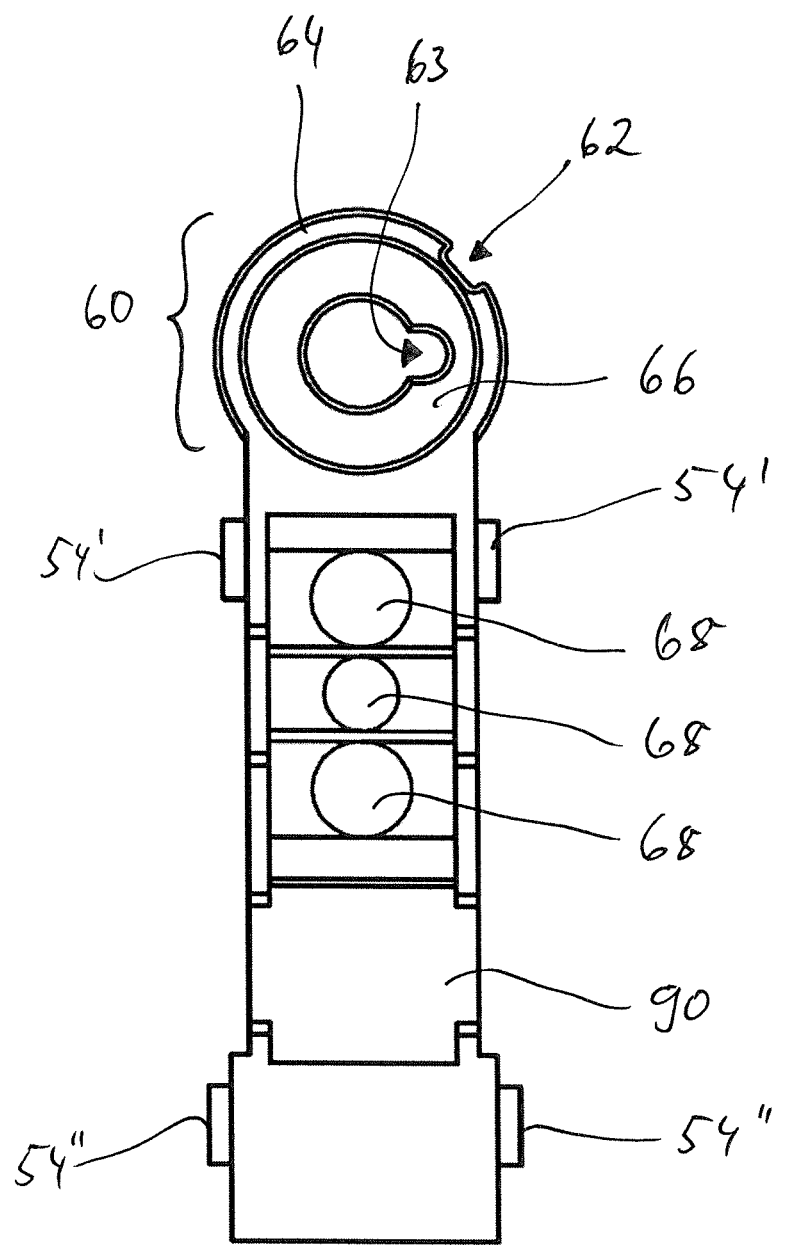
FIG. 4 is a plan view from above of a lens element of the apparatus of FIG. 1.

Further details on the lens element 16 are shown in FIG. 4 in which the lens element 16 is shown in a plan view of the upper side of the lens element 16. The lens element 16 shown in FIG. 4 has a first coding element 62 and a second coding element 63 at the coding section 60. The first coding element 62 is formed as a rectangular recess at the outer periphery of the hollow cylinder 64 of the coding section 60, with the first coding element 62 extending in parallel with the cylinder axis (perpendicular to the plane of the paper in FIG. 4) such that a rectangular groove is produced in the cylinder jacket of the hollow cylinder 64. A ring disk 66 extends within the hollow cylinder 64 perpendicular to its longitudinal axis. The second coding element 63 that is configured as a substantially semicircular recess and that extends in parallel with the cylinder axis as a round groove is provided at the inner periphery of the ring disk 66.

The first coding element 62 is only provided by way of example for the purpose of identifying the underlying apparatus 10 with respect to an apparatus type. An apparatus type is in particular characterized by the respective configuration of the lens element 16, of the upper part and/or of the first aperture element and by the equipping of the carrier device 12 with optoelectronic transmitters 40 or receivers 42. In this respect, the position and the configuration of lens sections 68 of the lens elements 16 can in particular differ. The second coding element 63 is provided to identify the apparatus 10 with respect to a bus that is provided for connecting the carrier device 12 to a microcontroller.

This list is only by way of example. In principle, the encoding elements 62, 63 can identify the optoelectronic apparatus 10 with respect to freely definable features. The coding elements 62, 63 are only defined, in addition to their shape, in dependence on their angular position about the longitudinal axis of the hollow cylinder 64, with the angular position of the respective coding element 62, 63, enabling an unambiguous identification of the apparatus 10 with respect to the feature associated with the respective coding element 62, 63.

Two perspective views of an installation site for an optoelectronic apparatus 10 are shown in FIG. 5 that is also called an installation environment of the optoelectronic apparatus 10 in connection with the invention. In FIG. 5(*a*), the installation site is shown as such, i.e. without a respective apparatus 10 being installed. The installation site is characterized by a section of a base plate 70 having a rectangular opening 72 at whose inner longitudinal edges two mutually oppositely disposed latching arms 74', 74" are provided. Adjacent to a narrow side of the opening 72, a cylinder 76 is formed that extends perpendicular to the plane of the base plate 70 and that is provided with a central opening 78. The opening 78 can have an internal thread for a screw, not shown.

The cylinder 76 has a first decoding element 80 and a second decoding element 81. The first decoding element 80 is of T shape and is spaced apart from the jacket surface of the cylinder 76 in the radial direction. The height of the decoding element 80 is less than the height of the cylinder 76. The second decoding element 81 is formed at the end face of the cylinder 76 and has a cylindrical shape sectionally. The cylinder 76 and the decoding elements 80 and 81 together form a decoding section 83 for the coding section 60 of an apparatus 10. The decoding section 83 is formed in one part with the base plate 70. The edges of the cylinder 76 and of the decoding elements 80 and 81 have a respective chamfer that facilitates the installation of the apparatus 10.

The apparatus 10 to be installed at the installation site shown in FIG. 5 (*a*) is installed with the upper side of the apparatus 10 at the front such that the apparatus 10 adopts the position shown in FIG. 5 (*b*) in which the upper side of the apparatus 10 faces the opening 72 of the base plate 70. It is ensured by the decoding section 83 that only that apparatus 10 can be installed that has a coding section 60 which is formed complementary to the decoding section 83 and which unambiguously defines the installation of the apparatus 10 at the respective installation site by shape matching. In the assembled state, the first coding element 62 engages into the first decoding element 80. The second coding element 63 furthermore engages sectionally into the second decoding element 81. The latching arms 74', 74" are furthermore latched to the latching catches 36 of the lower part 18 such that the apparatus 10 is securely fastened to the base plate 70.

A further installation site for an apparatus 10 is shown in FIG. 6, with the apparatus 10 being installed in reverse in FIG. 6 (*b*), unlike the case of FIG. 5 (*b*), i.e. the beam-emitting or beam-receiving upper side of the apparatus 10 is remote from the base plate 70. The apparatus 10 can thus be installed flexibly in different manners at an installation site formed substantially the same, with only the position of the coding elements 62, 63 and the positions of the decoding elements 80, 81 having to be coordinated with one another for this purpose (cf. FIG. 5 (*a*) and FIG. 6 (*a*)).

The base shape of the coding section 60 (in particular the hollow cylinder 64 with the ring disk 66) is preferably formed symmetrically with respect to a center plane of the optoelectronic apparatus 10 that is perpendicular to the vertical direction. It is furthermore preferred if a fastening device for fastening the optoelectronic apparatus 10 to an installation environment (in particular the latching catches 36 of the holding device for the latching arms 74', 74" of the base plate 70) is formed symmetrically with respect to a center plane of the optoelectronic apparatus 10 that is perpendicular to the vertical direction. The apparatus 10 can hereby selectively be particularly simply fastened in one of two different alignments of its upper side at the installation environment, as has been explained with reference to FIGS. 5 and 6.

Further details with respect to the carrier device 12 will be explained with reference to FIGS. 7 to 9 in the following. The carrier device 12 shown in FIG. 7 corresponds to that of FIG. 1. The carrier device 12 shown in a top view in FIG. 8 substantially differs from the carrier device 12 shown in FIG. 7 in that the carrier device 12 of FIG. 8 does not have an ASIC 44.

The carrier device 12 generally has a plurality of electrically conductive contact tracks 92 that are formed at a segmented lead strip 93. In the embodiment variant of the carrier device 12 shown, five respective contact tracks 92 are provided by way of example that extend in the longitudinal direction at the upper side of the carrier device 12 through all of the five contact chambers 38 and that are substantially in parallel with one another. Each contact track 92 is thus electrically contactable in every contact chamber 38. It is understood that for this purpose each contact track 92 does not have to extend completely through a respective contact chamber 38. A respective contact track 92 can thus also only extend sectionally through a contact chamber 38 or can only be sectionally exposed, with e.g. an optoelectronic receiver 42 nevertheless being able to be installed in the respective contact chamber 38.

A centrally arranged contact track 92' is provided for the installation of (opto)electronic components 40, 42, 44 and the components 40, 42, 44 are fastened to said contact track in a variable mounting and said contact track is also called an installation contact track in connection with the invention. In addition, the components 40, 42, 44 can be electrically contacted to the central contact track 92' (for example by direct contact at its lower side), with the central contact track 92' being able to bear a predefined electrical potential. Each of the components 40, 42, 44 is preferably electrically connected to at least one further contact track 92 (by means of a respective bonding wire 100). Once a component 40, 42, 44 has been installed in a respective contact chamber 38, the respective contact chamber 38 can be individually filled with a casting material, in particular with an epoxy resin, a silicone or the like (not shown). The durability of the carrier device and the reliability of the optoelectronic apparatus can hereby be improved and optical properties can be adapted (refractive index, spectral filtering).

The central contact track 92' is wider relative to the other adjacent contact tracks 92 so that components 40, 42, 44 of different sizes can be installed on the central contact track 92'. The central contact track 92' furthermore has a locally broadened region 96 such that the ASIC 44 can be easily installed at the region 96 (FIG. 7). The other (non-central) contact tracks 92 are sectionally guided directly adjacent or indirectly adjacent via another contact track 92 along the region 96 and are contactable via a respective lateral electrical connector 98. Furthermore, all the contact tracks 92, 92' are contactable via a respective end-face electrical connector 98, with the end-face electrical connectors 98 being disposed opposite the electrical connectors 46, 46' (contact tongues) in the longitudinal direction.

The central contact track 92' is integral with the electrical connector 46'. The other electrical connectors 46 are in contrast separate from the contact tracks 92 and are only contactable via a respective contact field 94 on the upper side of the carrier device 12, with the contact fields 94 being electrically insulated from the contact tracks 92. A contact field 94' is additionally provided that is connected to a lateral electrical connector 98'. The broadened region 96 of the central contact track 92' is arranged substantially between the contact fields 94 and the contact tracks 92 in the longitudinal direction. A respective contact track 92 can thus be electrically connected via the ASIC 44 to a respective electrical connector 46 with small wiring effort (FIG. 7). Alternatively, a respective contact track 92 can also be directly connected to a respective contact field 94 or to the respective electrical connector 46 by means of bonding wire 100 (FIG. 8).

The carrier device 12 has a frame section 102 having a plurality of partition webs 104 in the transverse direction. The frame section 102 defines the contact chambers 38, with optical crosstalk between the contact chambers 38 being suppressed in the horizontal direction, i.e. the frame section 102 is impermeable to light.

The carrier device 12 is shown in a lower view in FIG. 9. A plurality of substantially round contacting regions 106 for a respective electrical contacting are arranged at the lower side. One of the contacting regions 106 can particular serve as a so-called fuse pad. The contacting region 106' can be electrically connected to the upper-side contact field 94'.

A particular advantage of the carrier device 12 in accordance with FIGS. 7 to 9 comprises the contact chambers 38 being able to be equipped with (opto)electronic components, 40, 42, 44 in a variable configuration with respect to number and arrangement to be able to manufacture an optoelectronic apparatus 10 adapted to an individual application, with other configurations than those shown in FIG. 7 also being possible.

REFERENCE NUMERAL LIST 10 optoelectronic apparatus
12 carrier device
14 first aperture element
16 lens element
18 lower part
20 upper part or second aperture element
22 bottom section
24 side part
26 catch
28 meshing section
30 receiving space
32 opening
34 latching noses
36 latching catch
38 contact chamber
40 transmitter
42 receiver
44 ASIC
46 connector
48 projection
50 region
52 aperture section
54 projection
56 region
58 latching tab
60 coding section
62 first coding element
63 second coding element
64 hollow cylinder
66 ring disk
68 lens section
70 base plate
72 opening
74 latching arm
76 cylinder
78 opening
80 first decoding element
81 second decoding element
83 decoding section
90 engagement section
92 contact track
93 lead strip
94 contact field
96 broadened region
98 electrical connector
100 bonding wire
102 frame section
104 partition web
106 contacting region

The invention claimed is:

1. An optoelectronic apparatus, comprising:
a carrier device that has a longitudinal extent and a transverse extent, the longitudinal extent being greater than the transverse extent, wherein the carrier device has a plurality of electrically conductive contact tracks aligned in parallel with the longitudinal extent,
wherein the carrier device has an integrally formed frame formed at least in part by a light-impermeable material or covered at least in part by a light-impermeable layer and defining a plurality of contact chambers, the plurality of contact chambers aligned in parallel with the transverse extent at an upper side, at least two adjacent contact chambers having a length along the transverse extent greater than a width along the longitudinal extent, and at least one contact chamber having a width along the longitudinal extent greater than the width along the longitudinal extent of each of the at least two adjacent contact chambers and positioned adjacent to only one of the at least two adjacent contact chambers,
wherein each of the plurality of contact tracks extends continuously along and is electrically contactable in each of the plurality of contact chambers such that at least one of at least one optoelectronic transmitter and at least one optoelectronic receiver is installable in the respective contact chamber in a variable mounting, and
wherein at least one contact track is wider relative to other contact tracks adjacent to the wider contact track.

2. The optoelectronic apparatus in accordance with claim 1, wherein the carrier device has three, four, five or six of each contact tracks and contact chambers.

3. The optoelectronic apparatus in accordance with claim 1, wherein the contact chambers are separated from one another by partition webs that extend in parallel with the transverse extent.

4. The optoelectronic apparatus in accordance with claim 1, wherein the carrier device has an overmolded lead frame that comprises a segmented lead strip of metal that is partly surrounded by a frame section of plastic, with the frame section defining the plurality of contact chambers at an upper side of the lead strip.

5. The optoelectronic apparatus in accordance with claim 4, wherein the lead strip forms at least one electrical connector for a respective contact track.

6. The optoelectronic apparatus in accordance with claim 5, wherein the at least one electrical connector forms an elastic contact tongue.

7. The optoelectronic apparatus in accordance with claim 5, wherein the lead strip forms a plurality of electrical connectors.

8. The optoelectronic apparatus in accordance with claim 7, wherein the plurality of electrical connectors together form a contacting zone for an electrical plug-in connector.

9. The optoelectronic apparatus in accordance with claim 7, wherein at least one of the plurality of electrical connectors is electrically insulated from the plurality of contact tracks.

10. The optoelectronic apparatus in accordance with claim 7, wherein at least one of the plurality of electrical connectors is integral with one of the plurality of contact tracks.

11. The optoelectronic apparatus in accordance with claim 1, wherein the wider contact track is centrally located with respect to opposing sides of a contact chamber associated with the wider contact.

12. The optoelectronic apparatus in accordance with claim 11, wherein the wider contact track has an enlarged region for receiving an application-specific integrated circuit.

13. The optoelectronic apparatus in accordance with claim 1, wherein a lower side of the carrier device comprises at least one contacting region in which a respective one of the plurality of contact tracks is exposed for an electrical contact.

14. The optoelectronic apparatus in accordance with claim 1, wherein the optoelectronic apparatus further has a lens element and a holding device, wherein the lens element is provided above the carrier device and has at least one lens section for at least one of the at least one optoelectronic transmitter and the at least one optoelectronic receiver, and wherein the holding device holds the carrier device and the lens element relative to one another.

15. The optoelectronic apparatus in accordance with claim 1, wherein the optoelectronic apparatus further has at least one aperture element that is provided above the carrier device and has at least one aperture section for at least one of the at least one optoelectronic transmitter and the at least one optoelectronic receiver.

16. A system comprising:
a plurality of optoelectronic apparatus, each of the plurality of optoelectronic apparatus comprising a carrier device that has a longitudinal extent and a transverse extent, the longitudinal extent being greater than the transverse extent, wherein the carrier device has a plurality of electrically conductive contact tracks aligned in parallel with the longitudinal extent,
wherein the carrier device has an integrally formed frame formed at least in part by a light-impermeable material or covered at least in part by a light-impermeable layer and defining a plurality of integrally formed contact chambers aligned in parallel with the transverse extent at an upper side, at least two of the contact chambers adjacent to each other and having a length along the transverse extent greater than a width along the longitudinal extent, and at least one contact chamber having a width along the longitudinal extent greater than the width along the longitudinal extent of each of the at least two adjacent contact chambers and positioned adjacent to only one of the at least two adjacent contact chambers;
wherein each of the plurality of contact tracks extends continuously along and is electrically contactable in each of the plurality of contact chambers such that at least one of at least one optoelectronic transmitter and at least one optoelectronic receiver is installable in the respective contact chamber in a variable mounting,
wherein the contact chambers of at least some of the plurality of optoelectronic apparatus are equipped in different configurations with a respective at least one of: at least one optoelectronic transmitter and at least one optoelectronic receiver.

17. The system in accordance with claim 16, wherein each of the plurality of optoelectronic apparatus further has a respective lens element that is provided above the carrier device and at least one lens section for at least one of the at least one optoelectronic transmitter and the at least one optoelectronic receiver, with at least some optoelectronic apparatus having lens elements differing with respect to their respective shapes.

18. An optoelectronic apparatus, comprising
a carrier device that has a longitudinal extent and a transverse extent, the longitudinal extent being greater than the transverse extent, wherein the carrier device has a plurality of electrically conductive contact tracks aligned in parallel with the longitudinal extent, wherein the carrier device has a plurality of contact chambers aligned in parallel with the transverse extent at an upper side, the contact chambers being optically isolated from one another, at least two adjacent contact chambers having a length along the transverse extent greater than a width along the longitudinal extent, at least one contact chamber having a width along the longitudinal extent greater than the width along the longitudinal extent of each of the at least two adjacent contact chambers and positioned adjacent to only one of the at least two adjacent contact chambers, wherein each of the plurality of contact tracks is electrically contactable in each of the plurality of contact chambers such that at least one of at least one optoelectronic transmitter and at least one optoelectronic receiver is installable in the respective contact chamber in a variable mounting, wherein the carrier device has an overmolded lead frame that comprises a segmented lead strip of metal, the plurality of electrically conductive contact tracks being formed at the segmented lead strip, the segmented lead strip being partly surrounded by an integrally formed frame section of plastic, wherein the frame section comprises integrally formed partition webs that extend in parallel with the transverse extent of the carrier device, the frame section defining the plurality of contact chambers at an upper side of the segmented lead strip, the contact chambers being separated from one another by the partition webs, wherein at least portions of the plurality of electrically conductive contact tracks pass beneath the partition webs, and wherein the frame section and the partition webs are formed from a light-impermeable material or are covered at least sectionally by a light-impermeable coating.

\* \* \* \* \*